US012482628B2

(12) United States Patent
Despres et al.

(10) Patent No.: US 12,482,628 B2
(45) Date of Patent: Nov. 25, 2025

(54) CHLORINE-CONTAINING PRECURSORS FOR ION IMPLANTATION SYSTEMS AND RELATED METHODS

(71) Applicant: ENTEGRIS, INC., Billerica, MA (US)

(72) Inventors: Joseph R. Despres, Middletown, CT (US); Ying Tang, Brookfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 343 days.

(21) Appl. No.: 18/236,719

(22) Filed: Aug. 22, 2023

(65) Prior Publication Data

US 2024/0062987 A1 Feb. 22, 2024

Related U.S. Application Data

(60) Provisional application No. 63/399,772, filed on Aug. 22, 2022.

(51) Int. Cl.

| | |
|---|---|
| ***H01J 37/08*** | (2006.01) |
| ***H01J 37/16*** | (2006.01) |
| ***H01J 37/317*** | (2006.01) |

(52) U.S. Cl.

CPC .............. *H01J 37/08* (2013.01); *H01J 37/16* (2013.01); *H01J 37/3171* (2013.01); *H01J 2237/006* (2013.01)

(58) Field of Classification Search

CPC ........ H01J 37/08; H01J 37/16; H01J 37/3171; H01J 2237/006

See application file for complete search history.

(56) References Cited

U.S. PATENT DOCUMENTS

| | | | | |
|---|---|---|---|---|
| 5,188,705 | A * | 2/1993 | Swanson | H01L 21/32136 438/719 |
| 7,791,047 | B2 * | 9/2010 | Horsky | H01J 27/024 250/492.21 |
| 8,237,134 | B2 | 8/2012 | Kaim et al. | |
| 10,676,370 | B2 * | 6/2020 | Colvin | C23C 14/48 |
| 10,774,419 | B2 | 9/2020 | Kamenitsa et al. | |
| 11,299,802 | B2 * | 4/2022 | Byl | H01J 37/08 |
| 2010/0154835 | A1 * | 6/2010 | Dimeo | C23C 16/4405 134/31 |
| 2012/0252195 | A1 | 10/2012 | Jones et al. | |
| 2018/0346342 | A1 | 12/2018 | Colvin et al. | |
| 2019/0237290 | A1 | 8/2019 | Yuze et al. | |
| 2020/0194264 | A1 | 6/2020 | Tang et al. | |
| 2022/0013323 | A1 | 1/2022 | Colvin et al. | |
| 2022/0108863 | A1 | 4/2022 | Tang et al. | |
| 2022/0139664 | A1 | 5/2022 | Colvin et al. | |

FOREIGN PATENT DOCUMENTS

| | | | |
|---|---|---|---|
| KR | 20210009281 | A | 1/2021 |
| WO | 2014193867 | A1 | 12/2014 |
| WO | 2017223130 | A1 | 12/2017 |
| WO | 2022072831 | A1 | 4/2022 |

* cited by examiner

*Primary Examiner* — Sean M Luck

(57) ABSTRACT

A system and method for generating aluminum ions for implantation into a substrate. The system and method comprise flowing a chlorine-containing gas from a first vessel, optionally with a hydrogen-containing co-gas and optionally with a fluorine-containing co-gas, to an ion source chamber of an ion implantation device. The ion source chamber comprises a solid aluminum target material. At the ion source chamber, aluminum ions are generated for implantation into a substrate.

20 Claims, 3 Drawing Sheets

CHLORINE-CONTAINING PRECURSORS FOR ION IMPLANTATION SYSTEMS AND RELATED METHODS

FIELD

The present disclosure relates to the field of chlorine-containing precursors, including chlorine-containing source materials and chlorine-containing gases, for ion implantation systems and related methods.

BACKGROUND

The vaporizer of ion implantation devices must undergo heating and cooling during ion implantation processes. The heating and cooling can be a lengthy process, thereby making the ion implantation process inefficient. In addition, the vaporizer presents challenges for material handling and cleaning.

Ion implantation as practiced in semiconductor manufacturing involves doping of a chemical species into a substrate, such as a microelectronic device wafer, by impingement of energetic ions of such species on the substrate. To generate the ionic dopant species, a source of the dopant, which may for example be in the form of a halide or hydride of the dopant species, is subjected to ionization. This ionization is carried out using an ion source (a.k.a., "ion source apparatus") to generate an ion beam that contains the dopant species. The ion source generates ions within an "ion chamber" or "arc chamber".

In certain situations there is a need to generate aluminum ions with more effectivity.

SUMMARY

Some embodiments relate to a method of ion implantation. In some embodiments, the method of ion implantation comprises obtaining a first vessel. In some embodiments, the first vessel comprises at least one of a chlorine-containing source material, a chlorine-containing gas, a fluorine-containing co-gas, a hydrogen-containing co-gas, an inert gas, or any combination thereof. In some embodiments, the method of ion implantation comprises vaporizing the chlorine-containing source material to obtain a chlorine-containing gas. In some embodiments, the method of ion implantation comprises flowing at least the chlorine-containing gas from the first vessel to an ion source chamber of an ion implantation device. In some embodiments, the method of ion implantation comprises contacting the chlorine-containing gas with a solid aluminum target material disposed within the ion source chamber. In some embodiments, the method of ion implantation comprises generating aluminum ions at the ion source chamber for implantation into a substrate.

Some embodiments relate to a method of ion implantation. In some embodiments, the method of ion implantation comprises obtaining a first vessel, the first vessel comprising at least one of a chlorine-containing gas, a chlorine-containing source material, a fluorine-containing co-gas, a hydrogen-containing co-gas, an inert gas, or any combination thereof. In some embodiments, the method of ion implantation comprises flowing at least the chlorine-containing gas to an ion source chamber of an ion implantation device. In some embodiments, the method of ion implantation comprises contacting the chlorine-containing gas with a solid aluminum target material present within the ion source chamber. In some embodiments, the method of ion implantation comprises generating aluminum ions at the ion source chamber for implantation into a substrate.

Some embodiments relate to an ion implantation system. In some embodiments, the ion implantation system comprises an ion implantation device. In some embodiments, the ion implantation device comprises an ion source chamber comprising a solid aluminum source material. In some embodiments, the ion implantation device comprises a vaporizer fluidly coupled to the ion source chamber. In some embodiments, the ion implantation system comprises a first vessel. In some embodiments, the first vessel comprises at least one of a chlorine-containing source material, a chlorine-containing gas, a fluorine-containing co-gas, a hydrogen-containing co-gas, an inert gas, or any combination thereof. In some embodiments, the first vessel is fluidly couplable to the ion source chamber of the ion implantation device. In some embodiments, the ion implantation system is configured to generate aluminum ions for implantation into a substrate.

Some embodiments relate to a supply package. In some embodiments, the supply package comprises a first vessel comprising at least one of a chlorine-containing source material, a chlorine-containing gas, a fluorine-containing co-gas, a hydrogen-containing co-gas, an inert gas, or any combination thereof. In some embodiments, the first vessel is fluidly couplable to an ion source chamber of an ion implantation device. In some embodiments, the first vessel is configured to vaporize the chlorine-containing source material to produce a chlorine-containing gas. In some embodiments, the first vessel is configured to discharge the chlorine-containing gas to the ion source chamber where aluminum ions are generated for implantation into a substrate.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though they may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Some embodiments relate to systems and methods for generating aluminum ions for implantation into a substrate. In some embodiments, a chlorine-containing gas is discharged from an external vessel and delivered, optionally with one or more co-gases, to an ion source chamber containing a solid aluminum target material. Within the ion source chamber, a chlorine-containing gas, such as $AlCl_3$, is ionized to generate ions, such as $Al^+$ ions and $Cl^+$ ions, which may interact with the solid aluminum target material to further generate $Al^+$ ions. At least some advantages of the systems and methods disclosed herein include enhancing the aluminum ion beam current and improving the operational efficiency of the ion implantation system, among other things.

Figure 1:
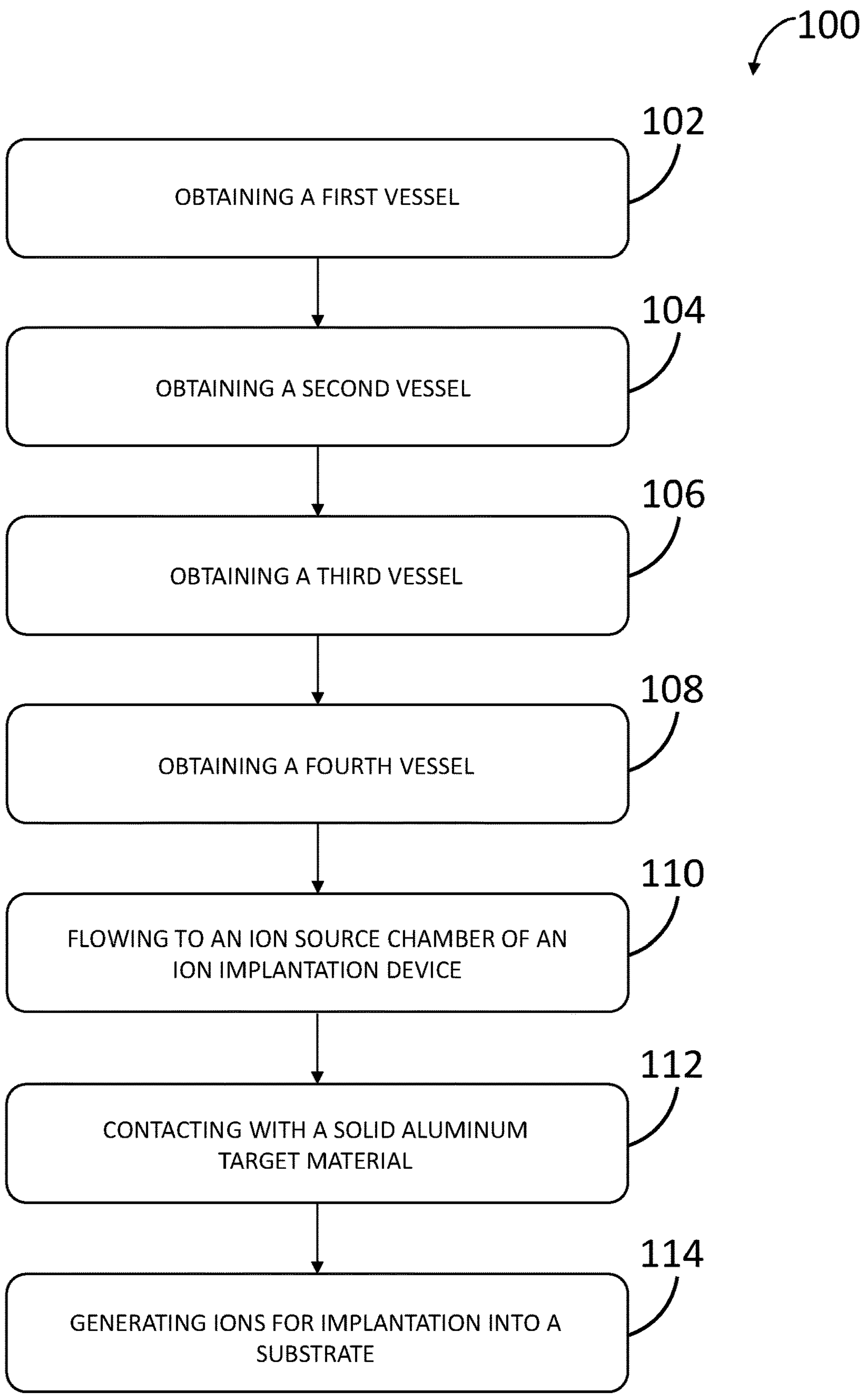
FIG. 1 is a flowchart of a method of ion implantation, according to some embodiments.

FIG. 1 is a flowchart of a method of ion implantation 100, according to some embodiments.

As shown in FIG. 1, the method of ion implantation 100 may comprise one or more of the following steps: a step 102 of obtaining a first vessel; a step 104 of obtaining a second vessel; a step 106 of obtaining a third vessel; a step 108 of obtaining a fourth vessel; a step 110 of flowing to an ion source chamber of an ion implantation device; a step 112 of contacting with a solid aluminum target material; and a step 114 of generating ions for ion implantation into a substrate.

At step 102, in some embodiments, the method of ion implantation comprises obtaining a first vessel. In some embodiments, the step 102 comprises obtaining a first vessel comprising at least one of a chlorine-containing source material, a chlorine-containing gas, or any combination thereof.

The first vessel may comprise a chlorine-containing precursor. In some embodiments, the chlorine-containing precursor comprises a chlorine-containing source material. In some embodiments, the chlorine-containing source material is a liquid. In some embodiments, the chlorine-containing source material is a solid. In some embodiments, the chlorine-containing source material is a vapor, a gas, or any combination thereof. Non-limiting examples of the chlorine-containing source material include, without limitation, at least one of $AlCl_3$, $Al_2Cl_6$, or any combination thereof. The $AlCl_3$ may be present within the first vessel as a solid. In embodiments in which the first vessel comprises a chlorine-containing source material, such as $AlCl_3$, the first vessel may be configured to vaporize the chlorine-containing source material. For example, in some embodiments, the first vessel is a vaporizer vessel configured to heat the chlorine-containing source material to produce a chlorine-containing gas within the first vessel and is further configured to discharge the chlorine-containing gas from the first vessel. In other embodiments, the chlorine-containing precursor comprises a chlorine-containing gas. Non-limiting examples of the chlorine-containing gas include, without limitation, at least one of $PCl_3$, $PCl_5$, $POCl_3$, $Cl_2$, $MoO_2Cl_2$, $WOCl_4$, $WCl_5$, $BCl_3$, HCl, $SiCl_4$, $GeCl_4$, $AsCl_3$, $SbCl_5$, $GaCl_3$, $AlCl_3$, $Al_2Cl_6$, or any combination thereof.

In particular embodiments of the present invention, aluminum ions are produced from an aluminum dopant source, e.g., solid aluminum target in an arc chamber, in the presence of chlorine-containing gas that comprises, consists or, or consists essentially of chlorine containing gas either alone or with hydrogen-containing gas. The chlorine-containing gas that is flowed to the arc chamber can comprise, consist of, or consist of a certain percent of $AlCl_3$, $Al_2Cl_6$, $Cl_2$ or a combination thereof, to the total amount of chlorine-containing gas flowing into the arc chamber, at least 50, 60, 70, 80, 90, 95, 98, 99, or 99.5 percent (volume) is $AlCl_3$, $Al_2Cl_6$, $Cl_2$ or combination thereof. The chlorine-containing gas may optionally be flowed in combination with a hydrogen-containing gas.

In some embodiments, the first vessel comprises at least one of a chlorine-containing source material, a chlorine-containing gas, a hydrogen-containing co-gas, a fluorine-containing co-gas, an inert gas, or any combination thereof.

At step 104, the method of ion implantation 100 comprises obtaining a second vessel. In some embodiments, the step 104 comprises obtaining a second vessel comprising a hydrogen-containing gas.

The second vessel may comprise a hydrogen-containing co-gas. The hydrogen-containing co-gas may comprise at least one of a hydrogen-containing compound, a hydride-containing compound, or any combination thereof. Non-limiting examples of the hydrogen-containing co-gas include, without limitation, at least one of $H_2$, $PH_3$, $AsH_3$, $SiH_4$, $Si_2H_6$, $B_2H_6$, $CH_4$, $C_2H_6$, $NH_3$, $N_2H_4$, $GeH_4$, $Ge_2H_6$, or any combination thereof. In some embodiments, the hydrogen-containing co-gas comprises a non-fluorinated gas.

In some embodiments the hydrogen-containing gas flows to an ion source in an amount that is within 2, 5, 10, 20, 30, 40, 50, 60, 70, 80, 90 volume percentage of the total gas flowing into the arc chamber. In some embodiments the hydrogen containing gas can vary based on the balanced beam current and/or the effect to the source conditions. For example, if a balanced beam current or the effect to the source conditions is produced at 50 percent hydrogen, the method may include flowing hydrogen-containing gas in an amount of from 45 to 55 percent (which is within 5 percentage points of 50 percent), or in an amount of from 40 to 60 percent (which is within 10 percentage points of 50 percent), or in an amount of from 30 to 70 percent (which is within 20 percentage points of 50 percent), or in an amount of from 20 to 80 percent (which is within 30 percentage points of 50 percent). If the maximum beam current is at or near an amount of zero percent hydrogen-containing gas, example methods of the invention may include flowing hydrogen-containing gas into the ion source in an amount that is below 20, 10, 5, or 2 percent.

In some embodiments the hydrogen containing gas is used to react with the residual chlorine when the chlorine containing gas is used to sputter or react with the aluminum ions from the solid aluminum target. For example, but not limited to, the hydrogen can be used to react with the residual chlorine gas to form HCl and wherein HCl is a gas which is easily pumped out of the ion source. In some embodiments, this prevents the chlorine from reacting elsewhere and potentially being corrosive to the ion source or any other potential contamination.

In some embodiments, the second vessel comprises at least one of a chlorine-containing source material, a chlorine-containing gas, a hydrogen-containing co-gas, a fluorine-containing co-gas, an inert gas, or any combination thereof.

At step 106, the method of ion implantation 100 comprises obtaining a third vessel. In some embodiments, the step 106 comprises obtaining a third vessel comprising a fluorine-containing gas.

The third vessel may comprise a fluorine-containing co-gas. The fluorine-containing co-gas may comprise at least one of a fluorine-containing compound, a fluoride-containing compound, or any combination thereof. Non-limiting examples of fluorine-containing co-gas include, without limitation, at least one of $BF_3$, $PF_3$, $PF_5$, $GeF_4$, $XeF_2$, $CF_4$, $B_2F_4$, $SiF_4$, $Si_2F_6$, $AsF_3$, $AsF_5$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$, $COF_2$, $SF_6$, $SF_4$, $SeF_6$, $NF_3$, $N_2F_4$, HF, $F_2$, or any combination thereof. In some embodiments, n is an integer from 1 to 100. In some embodiments, x is 0 or an integer from 1 to 100. In some embodiments, the fluorine-containing co-gas is different from the hydrogen-containing co-gas. In some embodiments, the fluorine-containing co-gas is different from the chlorine-containing precursor.

In some embodiments, the third vessel comprises at least one of a chlorine-containing source material, a chlorine-containing gas, a hydrogen-containing co-gas, a fluorine-containing co-gas, an inert gas, or any combination thereof.

At step 108, the method of ion implantation 100 comprises obtaining a fourth vessel. In some embodiments, the step 108 comprises obtaining a fourth vessel comprising an inert gas.

The fourth vessel may comprise an inert gas. The inert gas may include at least one of helium, neon, argon, krypton, xenon, nitrogen, or any combination thereof.

In some embodiments, the fourth vessel comprises at least one of a chlorine-containing source material, a chlorine-containing gas, a hydrogen-containing co-gas, a fluorine-containing co-gas, an inert gas, or any combination thereof.

At step 110, the method of ion implantation 100 comprises flowing to an ion source chamber of an ion implantation device. In some embodiments, the step 110 of flowing at least one of the chlorine-containing gas, the hydrogen-containing gas, the fluorine-containing gas, or any combination thereof to an ion source chamber of an ion implantation device.

The chlorine-containing gas, the hydrogen-containing gas, and the fluorine-containing gas may flow to the ion source chamber as a mixture, or the chlorine-containing gas, the hydrogen-containing gas, and the fluorine-containing gas may flow via separate gas lines to the ion source chamber where the chlorine-containing gas, the hydrogen-containing gas, and the fluorine-containing gas are mixed. In some embodiments, the flowing of each of the chlorine-containing gas, the hydrogen-containing gas, and the fluorine-containing gas may independently proceed under vacuum or via a pump. In some embodiments, the flowing is performed under pressure, such as a pressure in a range of 2 Torr to 750 Torr, or any range or subrange between 2 Torr and 750 Torr.

At step 112, the method of ion implantation 100 comprises contacting with a solid aluminum target material. In some embodiments, the step 112 comprises contacting at least one of the chlorine-containing gas, the hydrogen-containing gas, the fluorine-containing gas, or any combination thereof with a solid aluminum target material.

The solid aluminum target material may comprise a solid aluminum or aluminum-containing material. In some embodiments, the solid aluminum target material is disposed within the ion source chamber of the ion implantation device. For example, in some embodiments, the solid aluminum target material is disposed as a solid at an interior of the ion source chamber. The solid aluminum target material may be disposed at a sidewall of the ion source chamber, optionally as part of a replaceable liner structure. In some embodiments, the solid aluminum target material is biased to a voltage for sputtering of aluminum from the solid aluminum target material. In some embodiments, a biased voltage is not applied to the solid aluminum target material. The solid aluminum target material may comprise, for example and without limitation, at least one of aluminum, aluminum oxide, aluminum nitride, aluminum carbide, aluminum boride, or any combination thereof. In some embodiments, the solid aluminum target material comprises at least one aluminum isotope above a natural abundance of such isotope.

In some embodiments of this disclosure includes, but is not limited to, generating specifically aluminum ions at the ion source chamber for implantation into a substrate. In order to generate the aluminum ions effectively, the disclosed process includes using chlorine as a sputtering and/or reacting gas of the solid aluminum target. This allows for a higher generation of aluminum ions.

At step 114, the method of ion implantation 100 comprises generating ions for ion implantation into a substrate. In some embodiments, the step 114 comprises generating aluminum ions at the ion source chamber for implantation into a substrate. The aluminum ions generated at the ion source chamber for implantation may comprise at least one of $Al_2^+$, $Al^+$, $Al^{2+}$, $Al^{3+}$, or any combination thereof.

In some embodiments of this disclosure, the generation of the aluminum ions that are generated can be a higher quantity compared to alternative gas to generate aluminum ions. Chlorine containing gas has the benefit of increased beam current and/or improved source life than other gases used in generating aluminum ions.

Figure 2:
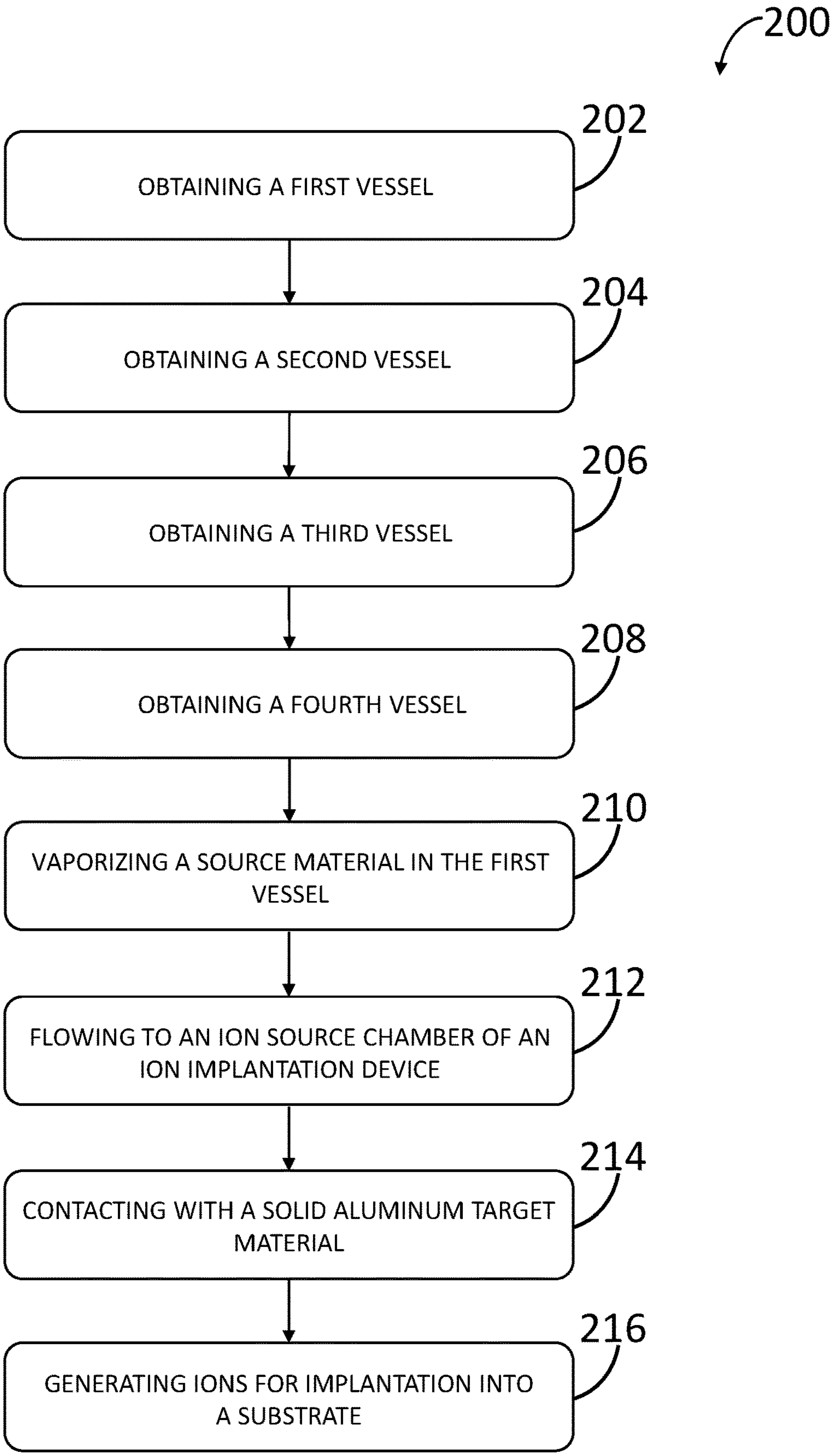
FIG. 2 is a flowchart of a method of ion implantation, according to some embodiments.

FIG. 2 is a flowchart of a method of ion implantation 200, according to some embodiments.

As shown in FIG. 2, the method of ion implantation 200 may comprise one or more of the following steps: a step 202 of obtaining a first vessel; a step 204 of obtaining a second vessel; a step 206 of obtaining a third vessel; a step 208 of obtaining a fourth vessel; a step 210 of vaporizing a source material in the first vessel; a step 212 of flowing to an ion source chamber of an ion implantation device; a step 214 of contacting with a solid aluminum target material; and a step 216 of generating ions for ion implantation into a substrate. The method of ion implantation 200 is similar to the method of ion implantation 100, except the method of ion implantation 200 includes a step of vaporizing the source material in the first vessel. For simplicity, same or similar steps are not repeated here.

At step 210, in some embodiments, the method of ion implantation 200 comprises vaporizing a source material in the first vessel. In some embodiments, the step 210 comprises vaporizing the chlorine-containing source material to obtain a chlorine-containing gas.

The vaporization of the chlorine-containing source material may be performed by heating the chlorine-containing source material. For example, in some embodiments, the vaporizing comprises heating the chlorine-containing source material to a temperature sufficient to vaporize the chlorine-containing source material. The applied heat may be applied directly to the chlorine-containing source material or may be applied indirectly via the first vessel which heats the chlorine-containing source material. In some embodiments, the temperature is a temperature in a range of 100° C. to 180° C. In some embodiments, the temperature is a temperature in a range of 60° C. to 250° C., or a subrange between 60° C. to 250° C. It will be appreciated that the temperature to which the chlorine-containing source material is heated may depend on, among other things, the type of source material, the phase in which the source material is present (e.g., as a solid or as a liquid), the conditions under which the source material is being stored (e.g., the conditions within, and optionally outside, the first vessel), or a combination thereof. Accordingly, in other embodiments, the temperature may vary above and below that range.

According to some embodiments of the present disclosure, due to the vaporization of the chlorine containing gas the it reduces the deposit on the key surfaces within the ion source. This can increase the ion source life compared to previous methods used to generate aluminum ions in an ion source. In some embodiments, the decrease of the deposit/contamination on surfaces of the ion source from previous methods used in the art.

Figure 3:
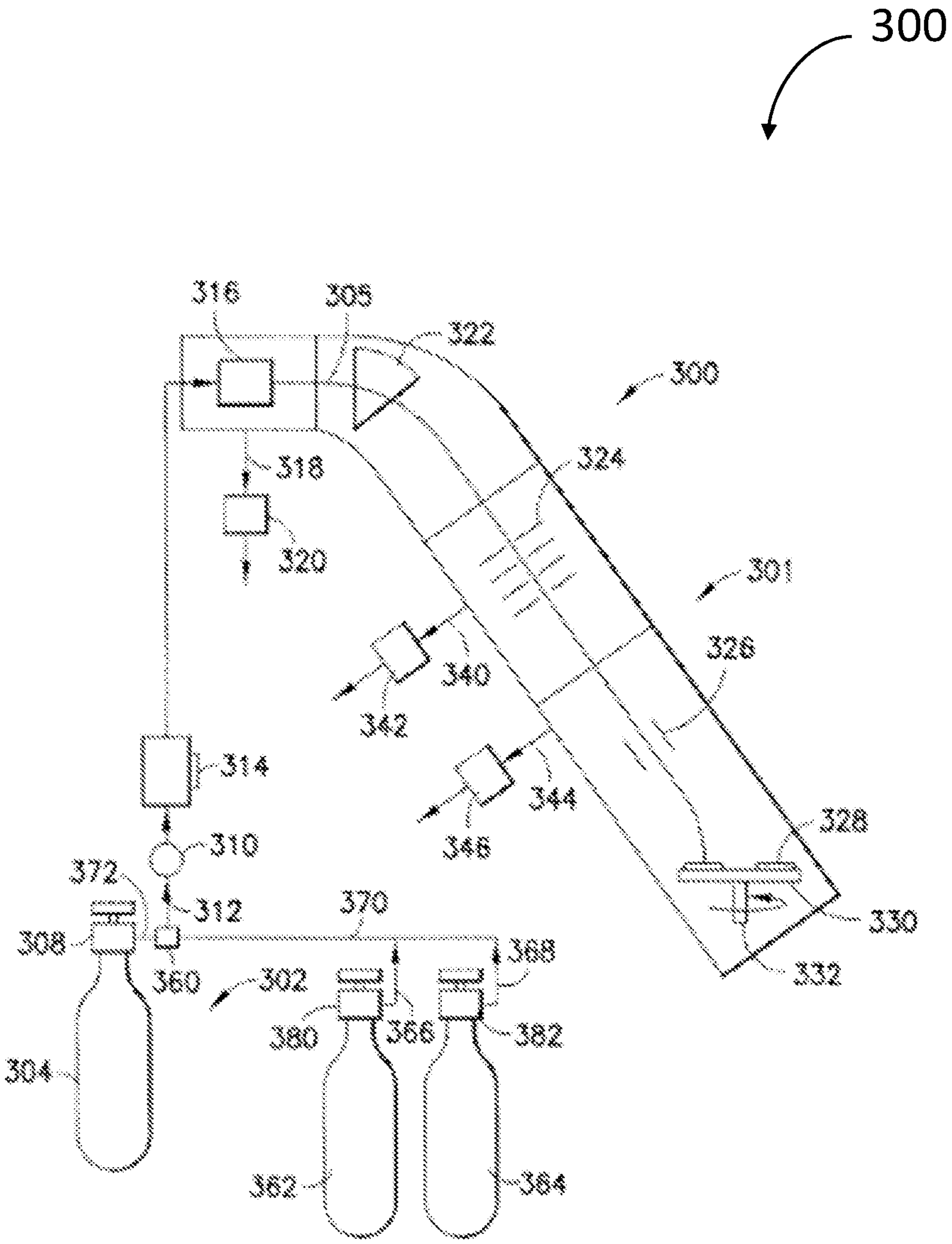
FIG. 3 is a schematic diagram of an ion implantation system, according to some embodiments.

FIG. 3 is a schematic diagram of an ion implantation system 200, according to some embodiments.

As shown in FIG. 3, a first vessel 302 comprises a vessel wall 304 enclosing an interior volume which contains a chlorine-containing precursor. The first vessel 302 includes a valve head 308. In some embodiments, the valve head 308 is fluidly coupled to a mixing chamber 360 (which is optional) via a dispensing line 372. The mixing chamber 360 is fluidly coupled to a second vessel 362 and a third vessel 364 via dispensing line 370. The second vessel 362 comprises a vessel wall enclosing an interior volume which contains a hydrogen-containing precursor. The second vessel includes a valve head 380 fluidly coupled to the mixing chamber 360 via a dispensing line 366 and a dispensing line 370. The third vessel 364 comprises a vessel wall enclosing an interior volume which contains a fluorine-containing precursor. The third vessel includes a valve head 382 fluidly coupled to the mixing chamber 360 via a dispensing line 368 and the dispensing line 370. Although not shown, in some embodiments, a fourth vessel comprising a vessel wall enclosing an interior volume which contains an inert gas is provided.

Each of the first vessel 302, the second vessel 362, and the third vessel 364 is configured to store and dispense a chlorine-containing gas, a hydrogen-containing gas, and a fluorine-containing gas, respectively. In embodiments in which the first vessel 302 contains a chlorine-containing source material, the first vessel 302 is configured to vaporize the chlorine-containing source material to obtain the chlorine-containing gas. In addition, each of the first vessel 302, the second vessel 362, and the third vessel 364 is fluidly couplable to an ion source chamber 316 of the ion implantation device 301. That is, for example, the first vessel 302, the second vessel 362, and the third vessel 364 are disengageably couplable to the ion implantation device 301. In some embodiments, the first vessel 302, the second vessel 362, and the third vessel 364 are external to the ion implantation device 301 and are different from a vaporizer of the ion implantation device 301.

In some embodiments, the first vessel 302 is configured to store and dispense a chlorine-containing gas, a hydrogen-containing gas, a fluorine-containing gas, an inert gas, or any combination thereof. In some embodiments, the second vessel 362 is configured to store and dispense a chlorine-containing gas, a hydrogen-containing gas, a fluorine-containing gas, an inert gas, or any combination thereof. In some embodiments, the third vessel 364 is configured to store and dispense a chlorine-containing gas, a hydrogen-containing gas, a fluorine-containing gas, an inert gas, or any combination thereof. In some embodiments, the fourth vessel (not shown) is configured to store and dispense a chlorine-containing gas, a hydrogen-containing gas, a fluorine-containing gas, an inert gas, or any combination thereof. In some embodiments, the ion implantation system 300 does not include at least one of the first vessel 302, the second vessel 362, the third vessel 364, the fourth vessel (not shown), or any combination thereof.

The mixing chamber 360 is fluidly coupled to the ion source chamber 301 via a dispensing line 312. A pressure sensor 310 and a mass flow controller 314 are disposed in the dispensing line 312. Although not shown, it will be appreciated that other monitoring components and sensing components may be fluidly coupled or disposed in at least one of the dispensing line 312, the dispensing line 372, the dispensing line 370, the dispensing line 366, the dispensing line 368, or any combination thereof, and interfaced with control means such as actuators, feedback and computer control systems, cycle timers, and the like. In addition, at least one of the dispensing line 312, the dispensing line 372, the dispensing line 370, the dispensing line 366, the dispensing line 368, or any combination thereof may be equipped with at least one of valves, controllers, and/or sensors for manually or automatically controlling the flow or other characteristics of the materials dispensed from the vessels and such valves, controllers and/or sensors may be coupled with or connected to the corresponding feed/dispensing lines in any suitable manner.

Such valves may in turn be coupled with valve actuators operatively linked to a central processor unit (CPU). The CPU may be coupled in signal communication relationship with the aforementioned controllers and/or sensors, and programmably arranged to control the rates, conditions, and amounts of fluids dispensed from each of the vessels in relation to each other, so that the fluid flowing from the mixing chamber 360 in line 312 to the ion source chamber 316 has a desired composition, temperature, pressure and flow rate for carrying out an ion implantation process.

In the illustrated embodiment, the ion implantation device 301 includes an ion source chamber 316. In some embodiments, the ion source chamber 316 contains a solid aluminum target material. The ion source chamber 316 receives the fluid from line 312 and generates an ion beam 305. The ion beam 305 passes through the mass analyzer unit 322 which selects the ions needed and rejects the non-selected ions. The selected ions pass through the acceleration electrode array 324 and then the deflection electrodes 326. The resulting focused ion beam is impinged on a substrate element 328 disposed on a rotatable holder 330 mounted on a spindle 332. The ion beam of dopant ions is used to dope the substrate as desired to obtain a doped structure.

The various sections of the ion implantation device 301 are exhausted through lines 318, 340, 344 via pumps 320, 342, 346, respectively.

Some embodiments relate to a supply package. In some embodiments, the supply package comprises at least one of a first vessel, a second vessel, a third vessel, or any combination thereof.

The first vessel (e.g., such as, the first vessel 302) may comprise a chlorine-containing precursor, such as, for example, a chlorine-containing source material, a chlorine-containing gas, or any combination thereof. In some embodiments, the first vessel is fluidly couplable to an ion source chamber of an ion implantation device. In some embodiments, the first vessel is configured to vaporize the chlorine-containing source material to produce a chlorine-containing gas. In some embodiments, the first vessel is configured to discharge the chlorine-containing gas to the ion source chamber where aluminum ions are generated for implantation into a substrate.

The second vessel (e.g., such as, the second vessel 362) may comprise a hydrogen-containing co-gas. In some embodiments, the second vessel is fluidly couplable to the ion source chamber of the ion implantation device. In some embodiments, the second vessel is configured to discharge the hydrogen-containing co-gas to the ion source chamber.

The third vessel (e.g., such as, the second vessel 364) may comprise a fluorine-containing co-gas. In some embodiments, the third vessel is fluidly couplable to the ion source chamber of the ion implantation device. In some embodiments, the third vessel is configured to discharge the fluorine-containing co-gas to the ion source chamber.

Aspects

Various Aspects are described below. It is to be understood that any one or more of the features recited in the following Aspect(s) can be combined with any one or more other Aspect(s).

Aspect 1. A method of ion implantation comprising: obtaining a first vessel, the first vessel comprising a chlorine-containing source material; vaporizing the chlorine-containing source material to obtain a chlorine-containing gas; flowing the chlorine-containing gas from the first vessel to an ion source chamber of an ion implantation device; contacting the chlorine-containing gas with a solid aluminum target material disposed within the ion source chamber; and generating aluminum ions at the ion source chamber for implantation into a substrate.

Aspect 2. The method according to Aspect 1, wherein the chlorine-containing source material comprises at least one of $AlCl_3$, $Al_2Cl_6$, or any combination thereof.

Aspect 3. The method according to any one of Aspects 1-2, wherein the vaporizing comprises heating the chlorine-containing source material to a temperature in a range of 60° C. to 250° C.

Aspect 4. The method according to any one of Aspects 1-3, wherein the flowing comprises flowing the chlorine-containing gas at a pressure in a range of 2 Torr to 750 Torr.

Aspect 5. The method according to any one of Aspects 1-4, wherein the solid aluminum target material comprises at least one of aluminum, aluminum oxide, aluminum nitride, aluminum carbide, aluminum boride, or any combination thereof.

Aspect 6. The method according to any one of Aspects 1-5, wherein the aluminum ions comprise at least one of $Al_2^+$, $Al^+$, $Al^{2+}$, $Al^{3+}$, or any combination thereof.

Aspect 7. The method according to any one of Aspects 1-6, further comprising: obtaining a second vessel, the second vessel comprising a hydrogen-containing co-gas; and flowing the hydrogen-containing co-gas from the second vessel to the ion source chamber of the ion implantation device.

Aspect 8. The method according to any one of Aspects 1-7, wherein the hydrogen-containing co-gas comprises at least one of $H_2$, $PH_3$, $AsH_3$, $SiH_4$, $Si_2H_6$, $B_2H_6$, $CH_4$, $C_2H_6$, $NH_3$, $N_2H_4$, $GeH_4$, $Ge_2H_6$, or any combination thereof.

Aspect 9. The method according to any one of Aspects 1-8, further comprising: obtaining a third vessel, the third vessel comprising a fluorine-containing co-gas; and flowing the fluorine-containing co-gas from the third vessel to the ion source chamber of the ion implantation device.

Aspect 10. The method according to Aspect 9, wherein the fluorine-containing co-gas comprises at least one of $BF_3$, $PF_3$, $PF_5$, $GeF_4$, $XeF_2$, $CF_4$, $B_2F_4$, $SiF_4$, $Si_2F_6$, $AsF_3$, $AsF_5$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$, $COF_2$, $SF_6$, $SF_4$, $SeF_6$, $NF_3$, $N_2F_4$, HF, $F_2$, or any combination thereof; wherein n is 1 or greater, wherein x is 0 or greater.

Aspect 11. The method according to any one of Aspects 1-10, further comprising: obtaining a fourth vessel, the fourth vessel comprising an inert gas, wherein the inert gas comprises at least one of helium, neon, argon, krypton, xenon, nitrogen, or any combination thereof; and flowing the inert gas from the fourth vessel to the ion source chamber of the ion implantation device.

Aspect 12. A method of ion implantation comprising: obtaining a first vessel, the first vessel comprising a chlorine-containing gas; flowing the chlorine-containing gas to an ion source chamber of an ion implantation device; contacting the chlorine-containing gas with a solid aluminum target material present within the ion source chamber; and generating aluminum ions at the ion source chamber for implantation into a substrate.

Aspect 13. The method according to Aspect 12, wherein the chlorine-containing gas comprises at least one of $PCl_3$, $PCl_5$, $POCl_3$, $Cl_2$, $MoO_2Cl_2$, $WOCl_4$, $WCl_5$, $BCl_3$, HCl, $SiCl_4$, $GeCl_4$, $AsCl_3$, $SbCl_5$, $GaCl_3$, $AlCl_3$, $Al_2Cl_6$, or any combination thereof.

Aspect 14. The method according to any one of Aspects 12-13, wherein the solid aluminum target material comprises at least one of aluminum, aluminum oxide, aluminum nitride, aluminum carbide, aluminum boride, or any combination thereof.

Aspect 15. The method according to any one of Aspects 12-14, wherein the aluminum ions comprise at least one of $Al_2^+$, $Al^+$, $Al^{2+}$, $Al^{3+}$, or any combination thereof.

Aspect 16. The method according to any one of Aspects 12-15, further comprising: obtaining a second vessel, the second vessel comprising a hydrogen-containing co-gas; and flowing the hydrogen-containing co-gas from the second vessel to the ion source chamber of the ion implantation device.

Aspect 17. The method according to Aspect 16, wherein the hydrogen-containing co-gas comprises at least one of $H_2$, $PH_3$, $AsH_3$, $SiH_4$, $Si_2H_6$, $B_2H_6$, $CH_4$, $C_2H_6$, $NH_3$, $N_2H_4$, $GeH_4$, $Ge_2H_6$, or any combination thereof.

Aspect 18. The method according to any one of Aspects 12-17, further comprising: obtaining a third vessel, the third vessel comprising a fluorine-containing co-gas; and flowing the fluorine-containing co-gas from the third vessel to the ion source chamber of the ion implantation device.

Aspect 19. The method according to Aspect 18, wherein the fluorine-containing co-gas comprises at least one of $BF_3$, $PF_3$, $PF_5$, $GeF_4$, $XeF_2$, $CF_4$, $B_2F_4$, $SiF_4$, $Si_2F_6$, $AsF_3$, $AsF_5$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$, $COF_2$, $SF_6$, $SF_4$, $SeF_6$, $NF_3$, $N_2F_4$, HF, $F_2$, or any combination thereof; wherein n is 1 or greater, wherein x is 0 or greater.

Aspect 20. The method according to any one of aspects 12-19, further comprising: obtaining a fourth vessel, the fourth vessel comprising an inert gas, wherein the inert gas comprises at least one of helium, neon, argon, krypton, xenon, nitrogen, or any combination thereof; and flowing the inert gas from the fourth vessel to the ion source chamber of the ion implantation device.

Aspect 21. An ion implantation system comprising: an ion implantation device, the ion implantation device comprising: an ion source chamber comprising a solid aluminum source material; and a vaporizer fluidly coupled to the ion source chamber; a first vessel, the first vessel comprising at least one of: a chlorine-containing source material, a chlorine-containing gas, or any combination thereof; wherein the first vessel is fluidly couplable to the ion source chamber of the ion implantation device; wherein the ion implantation system is configured to generate aluminum ions for implantation into a substrate.

Aspect 22. The ion implantation system according to Aspect 21, wherein the solid aluminum source material comprises at least one of aluminum, aluminum oxide, aluminum nitride, aluminum carbide, aluminum boride, or any combination thereof.

Aspect 23. The ion implantation system according to any one of Aspects 21-22, wherein the chlorine-containing source material comprises at least one of $AlCl_3$, $Al_2Cl_6$, or any combination thereof.

Aspect 24. The ion implantation system according to any one of Aspects 21-23, wherein the chlorine-containing gas comprises at least one of $PCl_3$, $PCl_5$, $POCl_3$, $Cl_2$, $MoO_2Cl_2$, $WOCl_4$, $WCl_5$, $BCl_3$, HCl, $SiCl_4$, $GeCl_4$, $AsCl_3$, $SbCl_5$, $GaCl_3$, $AlCl_3$, $Al_2Cl_6$, or any combination thereof.

Aspect 25. The ion implantation system according to any one of Aspects 21-24, further comprising a second vessel, the second vessel comprising: a hydrogen-containing co-gas, wherein the second vessel is fluidly couplable to the ion source chamber of the ion implantation device.

Aspect 26. The ion implantation system according to Aspect 25, wherein the hydrogen-containing co-gas comprises at least one of $H_2$, $PH_3$, $AsH_3$, $SiH_4$, $Si_2H_6$, $B_2H_6$, $CH_4$, $C_2H_6$, $NH_3$, $N_2H_4$, $GeH_4$, $Ge_2H_6$, or any combination thereof.

Aspect 27. The ion implantation system according to any one of Aspects 21-26, further comprising a third vessel, the third vessel comprising: a fluorine-containing co-gas, wherein the third vessel is fluidly couplable to the ion source chamber of the ion implantation device.

Aspect 28. The ion implantation system according to Aspect 27, wherein the fluorine-containing co-gas comprises at least one of $BF_3$, $PF_3$, $PF_5$, $GeF_4$, $XeF_2$, $CF_4$, $B_2F_4$, $SiF_4$, $Si_2F_6$, $AsF_3$, $AsF_5$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$, $COF_2$, $SF_6$, $SF_4$, $SeF_6$, $NF_3$, $N_2F_4$, HF, $F_2$, or any combination thereof; wherein n is 1 or greater, wherein x is 0 or greater.

Aspect 29. The ion implantation system according to any one of Aspects 21-28, further comprising a fourth vessel, the fourth vessel comprising: an inert gas, wherein the inert gas comprises at least one of helium, neon, argon, krypton, xenon, nitrogen, or any combination thereof; wherein the fourth vessel is fluidly coupled to the ion source chamber of the ion implantation device.

Aspect 30. A supply package comprising: a first vessel comprising a chlorine-containing source material, wherein the first vessel is fluidly couplable to an ion source chamber of an ion implantation device, wherein the first vessel is configured: to vaporize the chlorine-containing source material to produce a chlorine-containing gas, and to discharge the chlorine-containing gas to the ion source chamber where aluminum ions are generated for implantation into a substrate.

Aspect 31. The supply package according to Aspect 30, further comprising: a second vessel comprising a hydrogen-containing co-gas, wherein the second vessel is fluidly couplable to the ion source chamber of the ion implantation device, wherein the second vessel is configured to discharge the hydrogen-containing co-gas to the ion source chamber.

Aspect 32. The supply package according to Aspect 31, wherein the hydrogen-containing co-gas comprises at least one of $H_2$, $PH_3$, $AsH_3$, $SiH_4$, $Si_2H_6$, $B_2H_6$, $CH_4$, $C_2H_6$, $NH_3$, $N_2H_4$, $GeH_4$, $Ge_2H_6$, or any combination thereof.

Aspect 33. The supply package according to any one of Aspects 30-32, further comprising: a third vessel comprising a fluorine-containing co-gas, wherein the third vessel is fluidly couplable to the ion source chamber of the ion implantation device, wherein the third vessel is configured to discharge the fluorine-containing co-gas to the ion source chamber.

Aspect 34. The supply package according to Aspect 33, wherein the fluorine-containing co-gas comprises at least one of $BF_3$, $PF_3$, $PF_5$, $GeF_4$, $XeF_2$, $CF_4$, $B_2F_4$, $SiF_4$, $Si_2F_6$, $AsF_3$, $AsF_5$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$, $COF_2$, $SF_6$, $SF_4$, $SeF_6$, $NF_3$, $N_2F_4$, HF, $F_2$, or any combination thereof; wherein n is 1 or greater, wherein x is 0 or greater.

Aspect 35. The supply package according to any one of Aspects 30-34, further comprising: a fourth vessel comprising an inert gas, wherein the inert gas comprises at least one of helium, neon, argon, krypton, xenon, nitrogen, or any combination thereof; wherein the fourth vessel is fluidly couplable to the ion source chamber of the ion implantation device, wherein the fourth vessel is configured to discharge the inert gas to the ion source chamber.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

Example 1

A vessel comprising $AlCl_3$ (solid) is fluidly coupled to an ion source chamber of an ion implantation device. The vessel is heated to vaporize the $AlCl_3$ (solid) and to produce $AlCl_3$ (vapor) and/or $Al_2Cl_6$ (vapor). The $AlCl_3$ (vapor) and/or $Al_2Cl_6$ (vapor) are discharged at a temperature up to about 150° C. and under pressure of 5 Torr to 200 Torr from the vessel to the ion source chamber via a heated gas manifold and heated gas lines which contain a mass flow controller and control valves. The $AlCl_3$ (vapor) and/or $Al_2Cl_6$ (vapor) is ionized within the ion source chamber and an enhanced aluminum ion beam current is measured.

Example 2

A vessel comprising $AlCl_3$ (solid) is fluidly coupled to an ion source chamber of an ion implantation device. The vessel is heated to vaporize the $AlCl_3$ (solid) and to produce $AlCl_3$ (vapor) and/or $Al_2Cl_6$ (vapor). The $AlCl_3$ (vapor) and/or $Al_2Cl_6$ (vapor) is discharged at a temperature up to about 150° C. and under pressure of 5 Torr to 200 Torr from the vessel to the ion source chamber via a heated gas manifold and heated gas lines which contain a mass flow controller and control valves. A second vessel comprising $H_2$ is fluidly coupled to the ion source chamber. The $H_2$ is discharged from the second vessel and delivered to the ion source chamber. The $AlCl_3$ (vapor) and/or $Al_2Cl_6$ (vapor) is ionized within the ion source chamber and an enhanced aluminum ion beam current is measured.

Example 3

A vessel comprising $AlCl_3$ (solid) is fluidly coupled to an ion source chamber of an ion implantation device. The vessel is heated to vaporize the $AlCl_3$ (solid) and to produce $AlCl_3$ (vapor) and/or $Al_2Cl_6$ (vapor). The $AlCl_3$ (vapor) is discharged at a temperature up to about 150° C. and under pressure of 5 Torr to 200 Torr from the vessel to the ion source chamber via a heated gas manifold and heated gas lines which contain a mass flow controller and control valves. The $AlCl_3$ (vapor) and/or $Al_2Cl_6$ (vapor) is contacted with a solid aluminum target material (e.g., Al, AlN, $Al_2O_3$) disposed within the ion source chamber. An enhanced aluminum ion beam current is measured and observed.

Example 4

A vessel comprising $AlCl_3$ (solid) is fluidly coupled to an ion source chamber of an ion implantation device. The vessel is heated to vaporize the $AlCl_3$ (solid) and to produce $AlCl_3$ (vapor) and/or $Al_2Cl_6$ (vapor). The $AlCl_3$ (vapor) is discharged at a temperature up to about 150° C. and under pressure of 5 Torr to 200 Torr from the vessel to the ion source chamber via a heated gas manifold and heated gas lines which contain a mass flow controller and a control valve. A second vessel comprising $H_2$ is fluidly coupled to the ion source chamber. The $H_2$ is discharged from the second vessel and delivered to the ion source chamber. The $AlCl_3$ (vapor) and/or $Al_2Cl_6$ (vapor) is contacted with a solid aluminum target material (e.g., Al, AlN, $Al_2O_3$) disposed within the ion source chamber. An enhanced aluminum ion beam current is measured and observed.

Example 5

A vessel comprising $PCl_3$ is fluidly coupled to an ion source chamber of an ion implantation device. The $PCl_3$ is discharged from the vessel and delivered to the ion source chamber. The $PCl_3$ is contacted with a solid aluminum target material (e.g., Al, AlN, $Al_2O_3$) disposed within the ion source chamber. An enhanced aluminum ion beam current is measured and observed.

Example 6

A vessel comprising $PCl_3$ is fluidly coupled to an ion source chamber of an ion implantation device. The $PCl_3$ is discharged from the vessel and delivered to the ion source chamber. A second vessel comprising $H_2$ is fluidly coupled to the ion source chamber. The $H_2$ is discharged from the second vessel and delivered to the ion source chamber. The $PCl_3$ is contacted with a solid aluminum target material (e.g., Al, AlN, $Al_2O_3$) disposed within the ion source chamber. An enhanced aluminum ion beam current is measured and observed.

What is claimed is:

1. A method of ion implantation comprising:
obtaining a first vessel, the first vessel comprising a chlorine-containing source material;
vaporizing the chlorine-containing source material to obtain a chlorine-containing gas;
flowing the chlorine-containing gas from the first vessel to an ion source chamber of an ion implantation device;
contacting the chlorine-containing gas with a solid aluminum target material disposed within the ion source chamber; and
generating aluminum ions at the ion source chamber for implantation into a substrate.

2. The method of claim 1, wherein the chlorine-containing source material comprises at least one of $AlCl_3$, $Al_2Cl_6$, or any combination thereof.

3. The method of claim 1, wherein the vaporizing comprises heating the chlorine-containing source material to a temperature in a range of 60° C. to 250° C.

4. The method of claim 1, wherein the flowing comprises flowing the chlorine-containing gas at a pressure in a range of 2 Torr to 750 Torr.

5. The method of claim 1, wherein the solid aluminum target material comprises at least one of aluminum, aluminum oxide, aluminum nitride, aluminum carbide, aluminum boride, or any combination thereof.

6. The method of claim 1, wherein the aluminum ions comprise at least one of $Al_2^+$, $Al^+$, $Al^{2+}$, $Al^{3+}$, or any combination thereof.

7. The method of claim 1, further comprising:
obtaining a second vessel, the second vessel comprising a hydrogen-containing co-gas; and
flowing the hydrogen-containing co-gas from the second vessel to the ion source chamber of the ion implantation device.

8. The method of claim 7, wherein the hydrogen-containing co-gas comprises at least one of $H_2$, $PH_3$, $AsH_3$, $SiH_4$, $Si_2H_6$, $B_2H_6$, $CH_4$, $C_2H_6$, $NH_3$, $N_2H_4$, $GeH_4$, $Ge_2H_6$, or any combination thereof.

9. A method of ion implantation comprising:
obtaining a first vessel, the first vessel comprising a chlorine-containing gas;
flowing the chlorine-containing gas to an ion source chamber of an ion implantation device;
contacting the chlorine-containing gas with a solid aluminum target material present within the ion source chamber; and
generating aluminum ions at the ion source chamber for implantation into a substrate.

10. The method of claim 9, wherein the chlorine-containing gas comprises at least one of $PCl_3$, $PCl_5$, $POCl_3$, $Cl_2$, $MoO_2Cl_2$, $WOCl_4$, $WCl_5$, $BCl_3$, HCl, $SiCl_4$, $GeCl_4$, $AsCl_3$, $SbCl_5$, $GaCl_3$, $AlCl_3$, $Al_2Cl_6$, or any combination thereof.

11. The method of claim 9, wherein the solid aluminum target material comprises at least one of aluminum, aluminum oxide, aluminum nitride, aluminum carbide, aluminum boride, or any combination thereof.

12. The method of claim 9, wherein the aluminum ions comprise at least one of $Al_2^+$, $Al^+$, $Al^{2+}$, $Al^{3+}$, or any combination thereof.

13. The method of claim 9, further comprising:
obtaining a second vessel, the second vessel comprising a hydrogen-containing co-gas; and
flowing the hydrogen-containing co-gas from the second vessel to the ion source chamber of the ion implantation device.

14. The method of claim 13, wherein the hydrogen-containing co-gas comprises at least one of $H_2$, $PH_3$, $AsH_3$, $SiH_4$, $Si_2H_6$, $B_2H_6$, $CH_4$, $C_2H_6$, $NH_3$, $N_2H_4$, $GeH_4$, $Ge_2H_6$, or any combination thereof.

15. The method of claim 9, further comprising:
obtaining a third vessel, the third vessel comprising a fluorine-containing co-gas; and
flowing the fluorine-containing co-gas from the third vessel to the ion source chamber of the ion implantation device.

16. An ion implantation system comprising:
an ion implantation device, the ion implantation device comprising:
an ion source chamber comprising a solid aluminum source material; and
a vaporizer fluidly coupled to the ion source chamber;
a first vessel, the first vessel comprising at least one of:

a chlorine-containing source material, a chlorine-containing gas, or any combination thereof;

wherein the first vessel is fluidly couplable to the ion source chamber of the ion implantation device;

wherein the ion implantation system is configured to generate aluminum ions for implantation into a substrate.

17. The ion implantation system of claim 16, wherein the solid aluminum source material comprises at least one of aluminum, aluminum oxide, aluminum nitride, aluminum carbide, aluminum boride, or any combination thereof.

18. The ion implantation system of claim 16, wherein the chlorine-containing source material comprises at least one of $AlCl_3$, $Al_2Cl_6$, or any combination thereof.

19. The ion implantation system of claim 16, wherein the chlorine-containing gas comprises at least one of $PCl_3$, $PCl_5$, $POCl_3$, $Cl_2$, $MoO_2Cl_2$, $WOCl_4$, $WCl_5$, $BCl_3$, HCl, $SiCl_4$, $GeCl_4$, $AsCl_3$, $SbCl_5$, $GaCl_3$, $AlCl_3$, $Al_2Cl_6$, or any combination thereof.

20. The ion implantation system of claim 16, further comprising a second vessel, the second vessel comprising:

a hydrogen-containing co-gas, wherein the second vessel is fluidly couplable to the ion source chamber of the ion implantation device.

* * * * *